US011201255B2

(12) United States Patent
Nagai et al.

(10) Patent No.: US 11,201,255 B2
(45) Date of Patent: Dec. 14, 2021

(54) CONCENTRATOR PHOTOVOLTAIC MODULE, CONCENTRATOR PHOTOVOLTAIC PANEL, AND CONCENTRATOR PHOTOVOLTAIC APPARATUS

(71) Applicant: SUMITOMO ELECTRIC INDUSTRIES, LTD., Osaka (JP)

(72) Inventors: Youichi Nagai, Osaka (JP); Kenji Saito, Osaka (JP); Kazushi Iyatani, Osaka (JP); Makoto Inagaki, Osaka (JP); Rui Mikami, Osaka (JP); Yoshiya Abiko, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 23 days.

(21) Appl. No.: 16/635,247

(22) PCT Filed: Apr. 19, 2018

(86) PCT No.: PCT/JP2018/016079
§ 371 (c)(1),
(2) Date: Jan. 30, 2020

(87) PCT Pub. No.: WO2019/030988
PCT Pub. Date: Feb. 14, 2019

(65) Prior Publication Data
US 2020/0373449 A1 Nov. 26, 2020

(30) Foreign Application Priority Data
Aug. 7, 2017 (JP) .............................. JP2017-152422

(51) Int. Cl.
*H01L 31/054* (2014.01)
*H02S 40/22* (2014.01)
(Continued)

(52) U.S. Cl.
CPC ........ *H01L 31/0543* (2014.12); *H01L 31/048* (2013.01); *H02S 30/10* (2014.12);
(Continued)

(58) Field of Classification Search
CPC .......... H02S 20/32; H02S 30/10; H02S 40/20; H02S 40/22; H02S 40/30; H01L 31/048; H01L 31/0543; H01L 31/05; H01L 31/049
See application file for complete search history.

(56) References Cited

U.S. PATENT DOCUMENTS

2006/0054212 A1* 3/2006 Fraas .................. H01L 31/0521
136/246
2009/0183762 A1 7/2009 Jackson et al.
(Continued)

FOREIGN PATENT DOCUMENTS

CN 102662381 A 9/2012
CN 103000714 A 3/2013
(Continued)

OTHER PUBLICATIONS

Jul. 17, 2018 International Search Report issued in International Patent Application No. PCT/JP2018/016079.

*Primary Examiner* — Lindsey A Bernier
(74) *Attorney, Agent, or Firm* — Oliff PLC

(57) ABSTRACT

A concentrator photovoltaic module includes: a concentrating portion configured by arranging a plurality of Fresnel lenses that concentrate sunlight; a plurality of power generating elements arranged at positions corresponding respectively to the plurality of Fresnel lenses; a plurality of ball lenses corresponding respectively to the plurality of power generating elements and guide the sunlight concentrated by the plurality of Fresnel lenses to the plurality of power generating elements; and a housing that contains the plurality of ball lenses and the plurality of power generating
(Continued)

elements. The housing includes a resin frame body, and a metal bottom plate that is fixed to the frame body, and on the inner surface of which the plurality of ball lenses and the plurality of power generating elements are arranged. The groove portion for reducing thermal expansion of the inner surface side of the bottom plate is on the inner surface of the bottom plate.

6 Claims, 11 Drawing Sheets

(51) Int. Cl.
  *H01L 31/048* (2014.01)
  *H02S 30/10* (2014.01)
  *H02S 20/32* (2014.01)
  *H01L 31/05* (2014.01)

(52) U.S. Cl.
  CPC ............. *H02S 40/22* (2014.12); *H01L 31/05* (2013.01); *H02S 20/32* (2014.12)

(56) References Cited

U.S. PATENT DOCUMENTS

| | | |
|---|---|---|
| 2010/0236603 A1 | 9/2010 | Menard et al. |
| 2015/0107670 A1 | 4/2015 | Kim et al. |
| 2016/0211794 A1 | 7/2016 | Kim et al. |
| 2017/0149377 A1* | 5/2017 | Inagaki ............... H01L 31/0543 |
| 2017/0213923 A1 | 7/2017 | Toya et al. |
| 2018/0212557 A1 | 7/2018 | Saito et al. |

FOREIGN PATENT DOCUMENTS

| | | | |
|---|---|---|---|
| CN | 103000714 B | 5/2015 | |
| JP | 2013-161867 A | 8/2013 | |
| WO | 2012/017274 A1 | 2/2012 | |
| WO | WO-2015199003 A1 * | 12/2015 | ......... H01L 31/0543 |
| WO | 2016/006571 A1 | 1/2016 | |
| WO | 2017/061335 A1 | 4/2017 | |

* cited by examiner

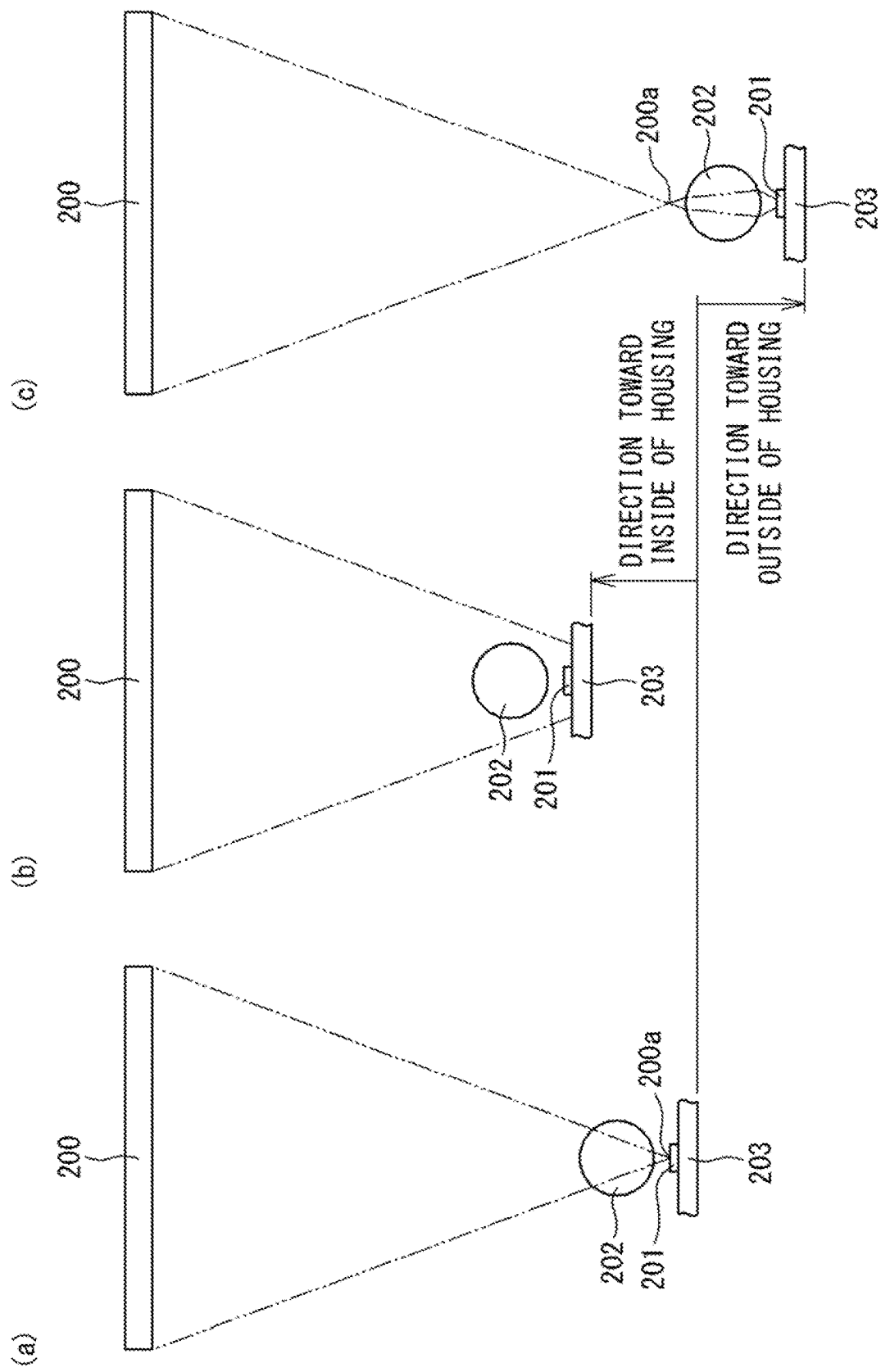

CONCENTRATOR PHOTOVOLTAIC MODULE, CONCENTRATOR PHOTOVOLTAIC PANEL, AND CONCENTRATOR PHOTOVOLTAIC APPARATUS

TECHNICAL FIELD

The present invention relates to a concentrator photovoltaic module, a concentrator photovoltaic panel, and a concentrator photovoltaic apparatus.

This application claims the priority based on Japanese Patent Application No. 2017-152422 filed on Aug. 7, 2017, the entire contents of which are incorporated by reference herein.

BACKGROUND ART

Units that constitute a basic unit of an optical system in a concentrator photovoltaic apparatus include a unit provided with a primary concentrating lens that is a convex lens, a secondary concentrating lens that is a spherical lens, and a power generating element, for example, (e.g., see Patent Literature 1 (FIG. 8)). For the power generating element, a solar cell made of a compound semiconductor element with high power generation efficiency is used. Sunlight is concentrated by the primary concentrating lens and incident on the secondary concentrating lens, and is further concentrated by the secondary concentrating lens and reaches the power generating element.

With such a configuration, a large amount of light energy can be concentrated on the small power generating element, and power can be generated with high efficiency. A large number of such concentrator photovoltaic units are arranged in a matrix to form a concentrator photovoltaic module, and a large number of such modules are arranged in a matrix to form a concentrator photovoltaic panel. The concentrator photovoltaic panel constitutes a concentrator photovoltaic apparatus together with a drive device configured to cause the panel to face the sun and follow the movement of the sun.

In the concentrator photovoltaic module, a large number of power generating elements are mounted on the surface of a bottom plate of a housing. For this bottom plate, a thin metal plate (e.g., aluminum, etc.) may be used from the viewpoint of ensuring thermal dissipation while holding down manufacturing cost. Moreover, a frame body that forms the outer frame of the housing supports the outer edge of the bottom plate. A resin material may be used for this frame body in order to hold down the manufacturing cost.

CITATION LIST

Patent Literature

Patent Literature 1: US Patent Application Publication No. US2010/0236603 A1

SUMMARY OF INVENTION

A concentrator photovoltaic module according to an embodiment includes: a concentrating portion configured by arranging a plurality of concentrating lenses that concentrate sunlight; a plurality of power generating elements arranged at positions corresponding respectively to the plurality of concentrating lenses; a plurality of secondary concentrating lenses that are provided corresponding respectively to the plurality of power generating elements and guide the sunlight concentrated by the plurality of concentrating lenses to the plurality of power generating elements; and a housing that contains the plurality of secondary concentrating lenses and the plurality of power generating elements. The housing includes a resin frame body, and a metal bottom plate that is fixed to the frame body, and on an inner surface of which the plurality of secondary concentrating lenses and the plurality of power generating elements are arranged. A groove portion for reducing thermal expansion of the inner surface side of the bottom plate is provided on the inner surface of the bottom plate.

Another embodiment is a concentrator photovoltaic panel comprising a plurality of the concentrator photovoltaic modules described above that are arranged.

Furthermore, another embodiment is a concentrator photovoltaic apparatus including: the concentrator photovoltaic panel described above; and a drive device that drives the concentrator photovoltaic panel to face the sun and follow movement of the sun.

BRIEF DESCRIPTION OF DRAWINGS

FIG. 11 is a view showing a state where a bottom plate of a concentrator photovoltaic module with a secondary concentrating lens has bent.

DESCRIPTION OF EMBODIMENTS

Technical Problem

Figure 1:
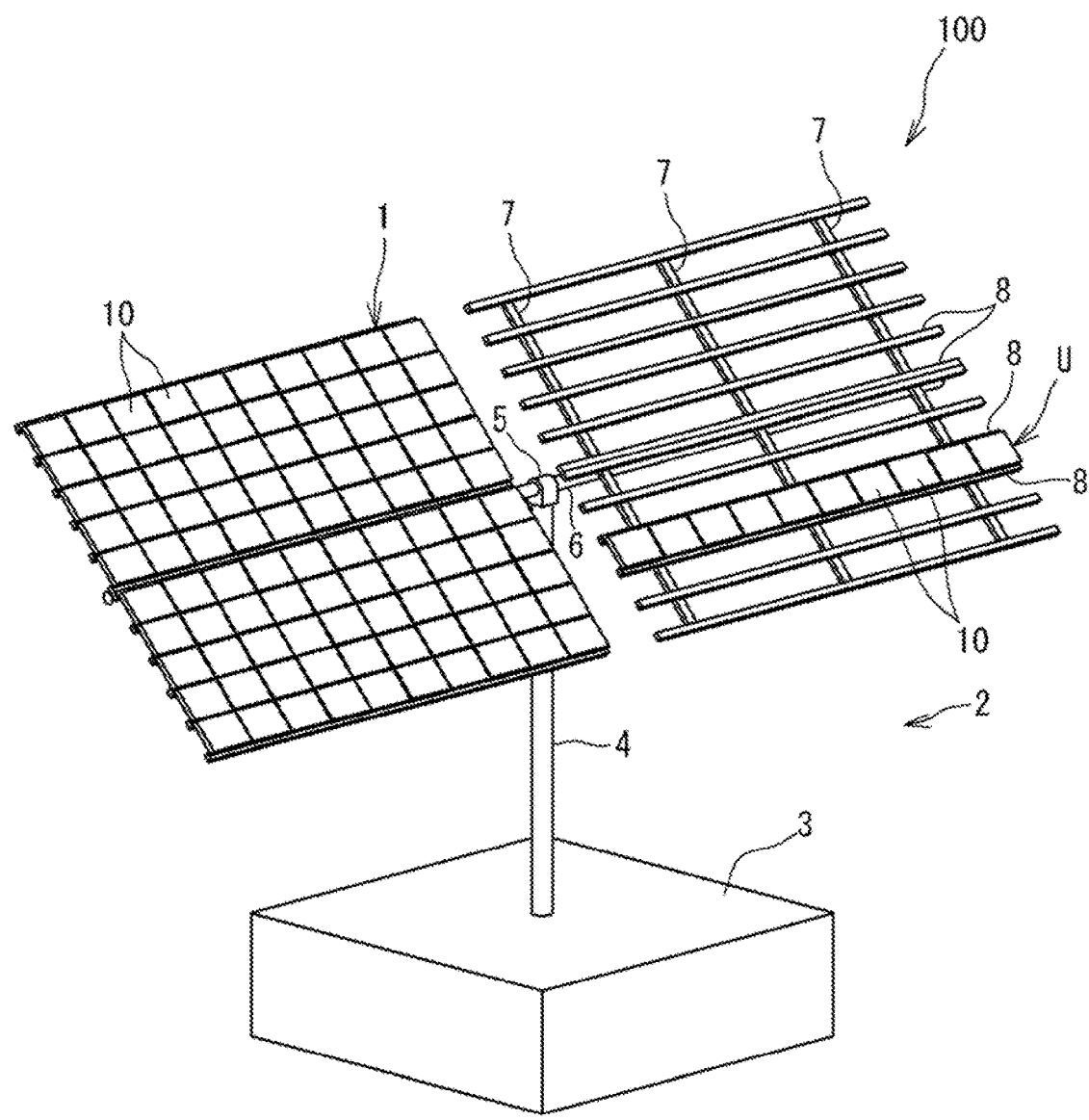
FIG. 1 is a perspective view showing an example of a concentrator photovoltaic apparatus.

In the concentrator photovoltaic module, when the temperature of the power generating element mounted on the bottom plate of the housing rises, the metal bottom plate is likely to expand thermally. Thus, when the expansion of the bottom plate in a surface direction is restricted by the resin frame body, the bottom plate bends so as to bulge in a convex shape toward the outside of the surface due to the difference in thermal expansion coefficient between the resin and the metal, and the position of the power generating element deviates from a position where the power generating element should be, to cause a decrease in power generation efficiency, which has been a problematic.

Particularly in the case of a concentrator photovoltaic module having a secondary concentrating lens, as shown in FIG. 11(a), a focal position 200a of a primary concentrating lens 200 is set in the vicinity of a power generating element 201. Further, a secondary concentrating lens 202 is disposed immediately before the power generating element 201, so that the position of the light incident surface of the secondary concentrating lens 202 is closer to the primary concentrating lens 200 than the focal position of the primary concentrating lens 200.

For this reason, when a bottom plate 203 bends in a convex shape in a direction toward the inside of the housing due to thermal expansion and the power generating element 201 moves closer to the primary concentrating lens 200, as shown in FIG. 11(b), the light concentration range of the primary concentrating lens 200 on the light incident surface (upper surface) of the concentrating lens 202 becomes larger than the light incident surface (diameter) of the secondary concentrating lens 202, and a leakage of concentrated light may occur.

On the other hand, when the bottom plate 203 bends in a convex shape in a direction toward the outside of the housing and the power generating element 201 moves away from the primary concentrating lens 200, as shown in FIG. 11(c), the power generating element 201 needs to move in a direction in which the focal position 200a passes through the upper surface of the secondary concentrating lens 202 and further away therefrom before the light concentration range of the primary concentrating lens 200 on the light incident surface (upper surface) of the secondary concentrating lens 202 becomes larger than the light incident surface of the secondary concentrating lens 202.

Hence in the case where the bottom plate bends in the direction toward the outside of the housing, the leakage of concentrated light is less likely to occur even when the bottom plate moves more than the case where the bottom plate bends in the direction toward the inside of the housing.

When the leakage of concentrated light as described above occurs, the sunlight that should be concentrated is not concentrated, thereby causing a significant decrease in power generation efficiency. Thus, even when the bottom plate thermally expands, it is necessary to at least prevent the bottom plate from bending in the direction toward the inside of the housing.

The present disclosure has been made in view of such circumstances, and an object of the present disclosure is to provide a concentrator photovoltaic module capable of preventing the bottom plate from bending in a direction toward the inside of the housing due to thermal expansion.

Advantageous Effects of Disclosure

According to the present disclosure, it is possible to prevent the bottom plate from bending in the direction toward the inside of the housing due to thermal expansion.

Description of Embodiments

First, the contents of the embodiment will be listed and described.

(1) A concentrator photovoltaic module according to an embodiment includes: a concentrating portion configured by arranging a plurality of concentrating lenses that concentrate sunlight; a plurality of power generating elements arranged at positions corresponding respectively to the plurality of concentrating lenses; a plurality of secondary concentrating lenses that are provided corresponding respectively to the plurality of power generating elements and guide the sunlight concentrated by the plurality of concentrating lenses to the plurality of power generating elements; and a housing that contains the plurality of secondary concentrating lenses and the plurality of power generating elements. The housing includes a resin frame body, and a metal bottom plate that is fixed to the frame body, and on an inner surface of which the plurality of secondary concentrating lenses and the plurality of power generating elements are arranged. A groove portion for reducing thermal expansion of the inner surface side of the bottom plate is provided on the inner surface of the bottom plate.

According to the photovoltaic module having the above configuration, since the groove portion for reducing the thermal expansion on the inner surface side of the bottom plate is provided on the inner surface of the bottom plate, when the bottom plate thermally expands, the amount of expansion due to the thermal expansion on the inner surface side can be made relatively smaller than the amount of expansion on the outer surface side that is the opposite surface of the inner surface. For this reason, when the bottom plate thermally expands, the bottom plate can be bent so as to protrude in the direction toward the outside of the housing, and as a result, the bottom plate can be prevented from bending in the direction toward the inside of the housing due to the thermal expansion.

(2) In the photovoltaic module, it is preferable that the plurality of power generating elements be mounted on a wiring board attached to the inner surface of the bottom plate, and a plurality of groove portions be provided to be spotted at positions corresponding to an attachment position of the wiring board on the inner surface of the bottom plate, and function as markers for positioning the wiring board.

In this case, it is not necessary to separately provide a positioning marker for the wiring board, and man-hours and cost can be reduced.

(3) In the photovoltaic module, the groove portion may include a linear first groove and a linear second groove intersecting with the first groove.

In this case, a direction in which the thermal expansion is reduced by the groove portion can be made multidirectional within the inner surface, and the position on the bottom plate can be clearly displayed by the groove portion.

(4) In the photovoltaic module, it is preferable that the bottom plate be in a rectangular shape having long sides and short sides, the plurality of groove portions be arranged along a long-side direction and a short-side direction, and an interval between a pair of the groove portions adjacent to each other in the short-side direction be narrower than an interval between a pair of the groove portions adjacent to each other in the long-side direction.

In this case, more groove portions are arranged along the short-side direction, and hence the groove portions can be arranged so as to divide the bottom plate in the long-side direction. As a result, it is possible to facilitate the bending in the direction toward the outside of the housing in the long-side direction in which the bottom plate is likely to bend as compared to the short-side direction, and it is possible to facilitate the bottom plate to bend so as to protrude in the direction toward the outside of the housing when the bottom plate expands thermally.

(5) Further, in the photovoltaic module, the frame body may include a frame main body portion that configures an outer frame, and a bottom plate holding portion that extends along the inner surface of the bottom plate inside the frame main body portion and is integral with the frame main body portion at both ends.

In this case, the bottom plate can be prevented from bending in the direction toward the inside of the housing due to the thermal expansion by the bottom plate holding portion.

(6) In the photovoltaic module, it is preferable that a contact surface that is in contact with the inner surface of the bottom plate in the bottom plate holding portion has a convex shape so as to protrude in the direction toward an outside of the housing.

In this case, since the bottom plate can be bent in advance in the direction toward the outside of the housing by the bottom plate holding portion, it is possible to more effectively prevent the bottom plate from bending in the direction toward the inside of the housing due to the thermal expansion.

(7) Another embodiment is a concentrator photovoltaic panel comprising a plurality of the concentrator photovoltaic modules described above that are arranged.

With this configuration, it is possible to prevent the bottom plate from bending in the direction toward the inside of the housing due to thermal expansion.

(8) Furthermore, another embodiment is a concentrator photovoltaic apparatus including: the concentrator photovoltaic panel described above; and a drive device that drives the concentrator photovoltaic panel to face the sun and follow movement of the sun.

With this configuration, it is possible to prevent the bottom plate from bending in the direction toward the inside of the housing due to thermal expansion.

Details of Embodiments

Hereinafter, preferred embodiments will be described with reference to the drawings.

In addition, at least a part of each embodiment described below may be combined in a freely selectable manner.

Concentrator Photovoltaic Apparatus and Concentrator Photovoltaic Panel

First, the configuration of the concentrator photovoltaic apparatus will be described.

FIG. 1 is a perspective view showing an example of a concentrator photovoltaic apparatus.

In FIG. 1, a concentrator photovoltaic apparatus 100 includes a concentrator photovoltaic panel 1 having a panel divided into two, right and left, wings, and a pedestal 2 that supports the concentrator photovoltaic panel 1 on the back-surface side.

In FIG. 1, the panel 1 on the right side of the page is shown with a part of the photovoltaic panel 1 omitted to show the structure of the pedestal 2.

The pedestal 2 includes a base 3 and a support portion 4 standing on the base 3. The base 3 is fixed to the ground. The support portion 4 is provided vertically. A drive device 5 is provided at a support point of the photovoltaic panel 1 at the upper end of the support portion 4. The drive device 5 drives the photovoltaic panel 1 so as to rotate in a direction of an elevation angle about a horizontally extending shaft 6. Further, the drive device 5 drives the photovoltaic panel 1 so as to rotate in a direction of an azimuth angle about the support portion 4.

The drive device 5 is controlled by a control device (not shown). The control device has a drive circuit for driving a built-in motor of the drive device 5. By the operation of the motor (stepping motor) of each shaft, the photovoltaic panel 1 can take an attitude of any angle with respect to each of the azimuth angle and the elevation angle.

The control device controls the drive device 5 so that the photovoltaic panel 1 faces the sun and follows the movement of the sun.

The shaft 6 driven by the drive device 5 is provided with a plurality of beams 7 in a direction orthogonal to the shaft 6. The photovoltaic panel 1 is fixed on the upper sides of the plurality of beams 7. The photovoltaic panel 1 is configured by, for example, arranging units U each made up of ten concentrator photovoltaic modules 10 arranged in a horizontal row in multiple stages.

The unit U includes a plurality of concentrator photovoltaic modules 10 and a pair of upper and lower attachment rails 8 that integrally fix the concentrator photovoltaic modules 10 in a state of being aligned in a row.

Each unit U is spanned over each beam 7 and fixed to the upper side of each beam 7.

Each wing of the photovoltaic panel 1 is made up of ten units U, for example. Thus, each wing of the photovoltaic panel 1 is configured by arranging 10×10 concentrator photovoltaic modules 10 in a matrix. Therefore, there are 200 concentrator photovoltaic modules 10 in the photovoltaic panels 1 of both wings.

Concentrator Photovoltaic Modules

Figure 2:
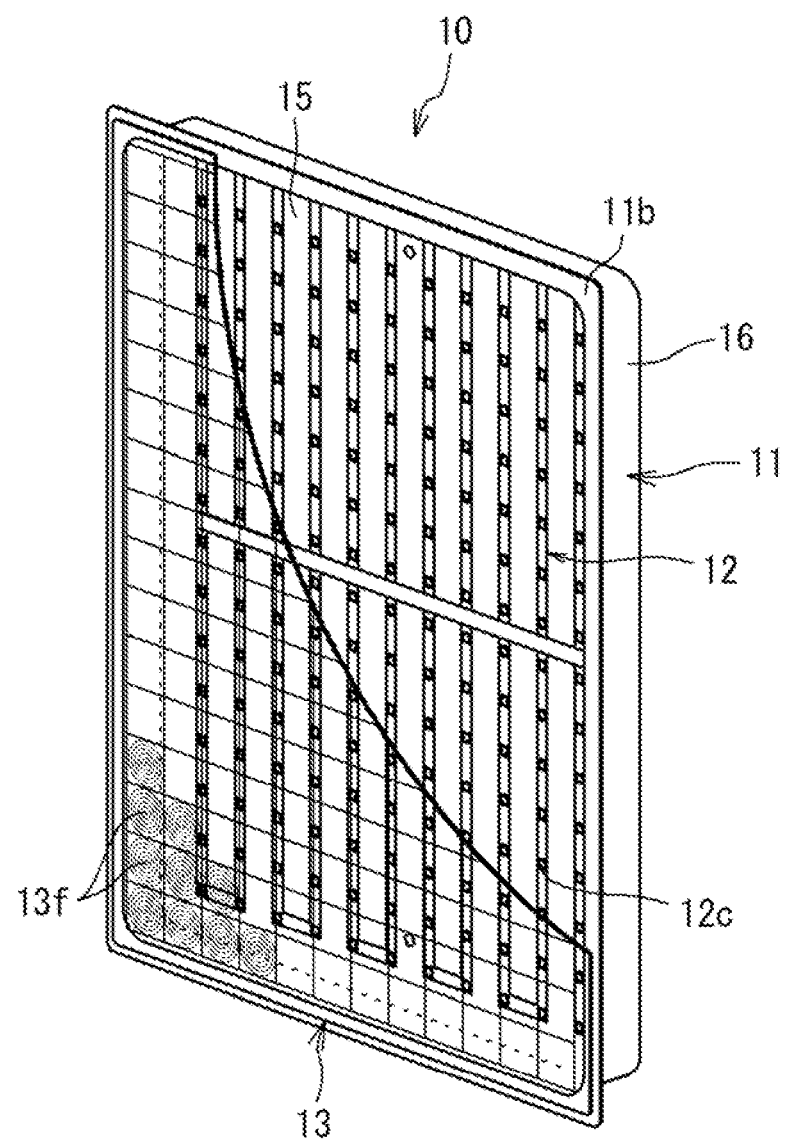
FIG. 2 is an enlarged perspective view showing an example of a concentrator photovoltaic module.

FIG. 2 is an enlarged perspective view showing an example of the concentrator photovoltaic module (hereinafter also simply referred to as the module) 10 (a part of the concentrating portion 13 has been broken). In FIG. 2, the module 10 includes, as major components, a box-shaped housing 11, flexible printed circuits 12 arranged in a plurality of rows on a bottom plate 15 of the housing 11, and a concentrating portion 13 attached to a flange portion 1ib of the housing 11 like a lid.

The concentrating portion 13 is a Fresnel lens array and is configured by arranging a plurality (e.g., 14×10=140) of Fresnel lenses 13f that concentrate sunlight. Such a concentrating portion 13 can be formed by, for example, using a glass plate as a base material and forming a silicone resin film on the back surface (inner surface) thereof. The Fresnel lens 13f is formed on this resin film.

The housing 11 includes the bottom plate 15 on which the flexible printed circuits 12 are disposed, and a frame body 16 to which the outer edge of the bottom plate 15 and the like are attached, and which holds the concentrating portion 13 so as to face the bottom plate 15. The housing 11 will be described in detail later.

Figure 3:
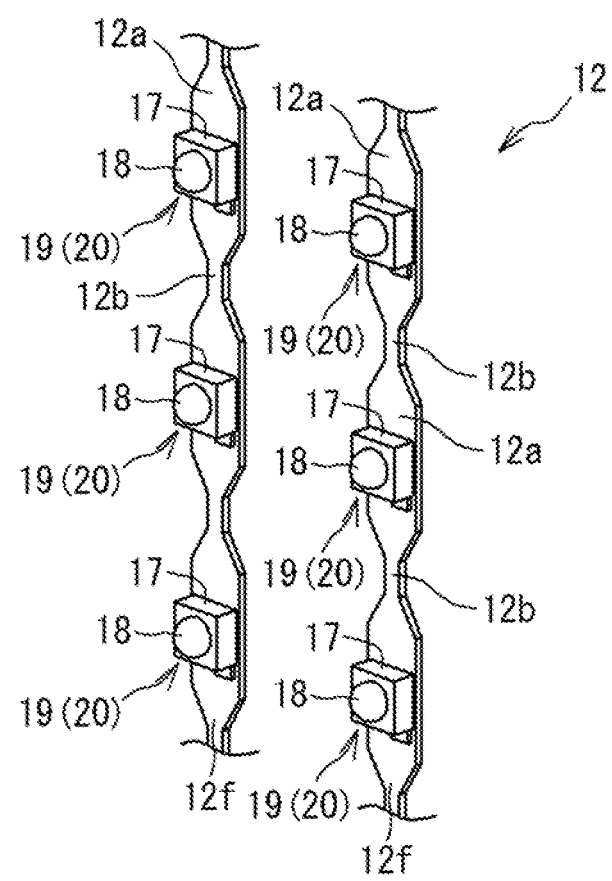
FIG. 3 is an enlarged perspective view of flexible printed circuits.

FIG. 3 is an enlarged perspective view of the flexible printed circuits 12.

In FIG. 3, the flexible printed circuit 12 of the present example is configured including a flexible substrate 12f on which a conductive pattern (not shown) is formed. A plurality of power generating elements (not shown in FIG. 4) are mounted on the flexible printed circuit 12. The power generating element is incorporated inside a package 17.

Each power generating element is disposed at a position corresponding to each of the plurality of Fresnel lenses 13f.

A ball lens 18 which is a secondary concentrating lens is attached onto the package 17. The package 17 including the power generating element and the ball lens 18 constitute a secondary concentrating portion 19.

The flexible printed circuit 12 is formed such that a wide portion 12a formed to have a large width and provided with the power generating element and the secondary concentrating portion 19, and a narrow portion 12b narrower than the wide portion 12a are arranged alternately. This saves material for the substrate.

Figure 4:
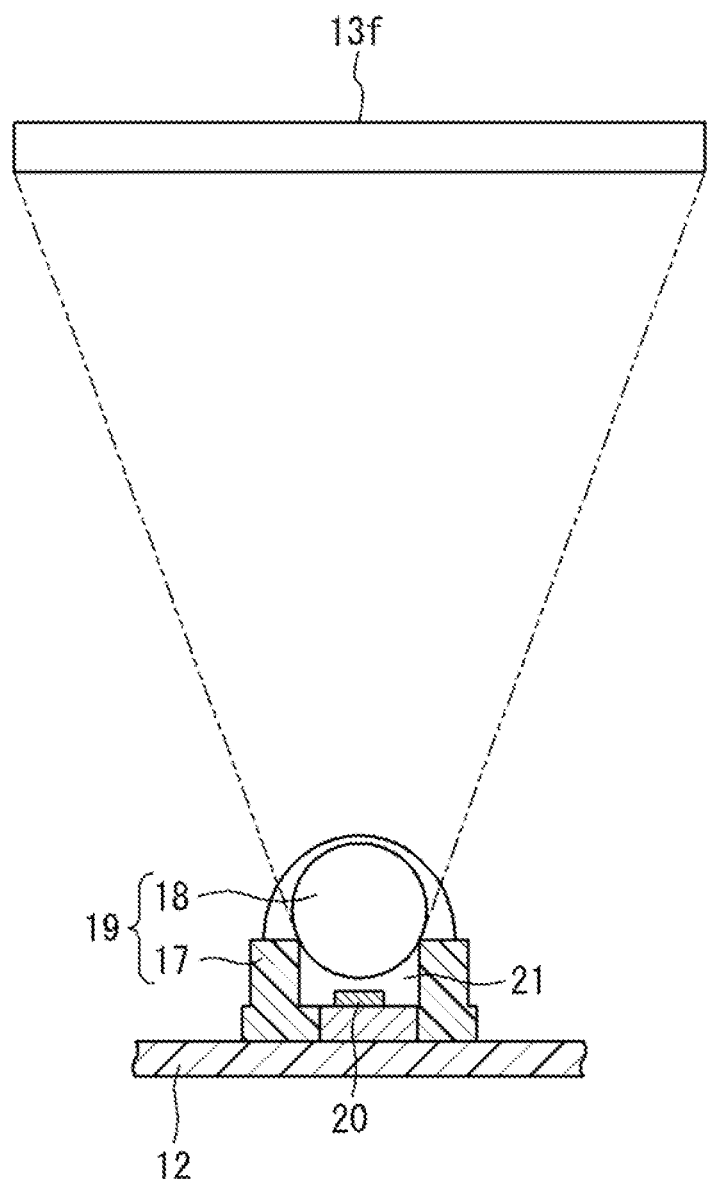
FIG. 4 is a view schematically showing a positional relationship between one Fresnel lens and a power generating element in a package disposed at a position corresponding to the Fresnel lens.

FIG. 4 is a view schematically showing the positional relationship between one Fresnel lens 13f and the power generating element in the package 17 disposed at a position corresponding to the Fresnel lens. In FIG. 4, the package 17 mounted on the flexible printed circuit 12 is shown in cross section.

As shown in FIG. 4, a power generating element 20 is mounted on the flexible printed circuit 12 in a state surrounded by the package 17. As the power generating element 20, a solar cell made of a compound semiconductor element with high power generation efficiency is used.

The ball lens 18 which is a spherical lens is supported at the upper end of the package 17 slightly away (floating) from the power generating element 20 and is disposed immediately before the power generating element 20.

The power generating element 20 and the ball lens 18 are disposed so as to substantially coincide with the optical axis of the Fresnel lens 13f as a primary concentrating lens. Hence the sunlight concentrated by the Fresnel lens 13f is guided to the power generating element 20 by the ball lens 18.

In this manner, the plurality of power generating elements 20 are arranged at positions corresponding to the respective Fresnel lenses 13f. The ball lens 18 is provided corresponding to each of the plurality of power generating elements.

A space between the power generating element 20 and the ball lens 18 in the package 17 is a sealing portion 21 filled with translucent resin. The power generating element 20 is hermetically sealed by the sealing portion 21 so that moisture, dust, and the like are prevented from adhering to the power generating element 20. The resin for the sealing portion 21 is, for example, silicone, and is poured in a liquid state and solidifies to become the sealing portion 21.

Housing According to First Embodiment

Figure 5:
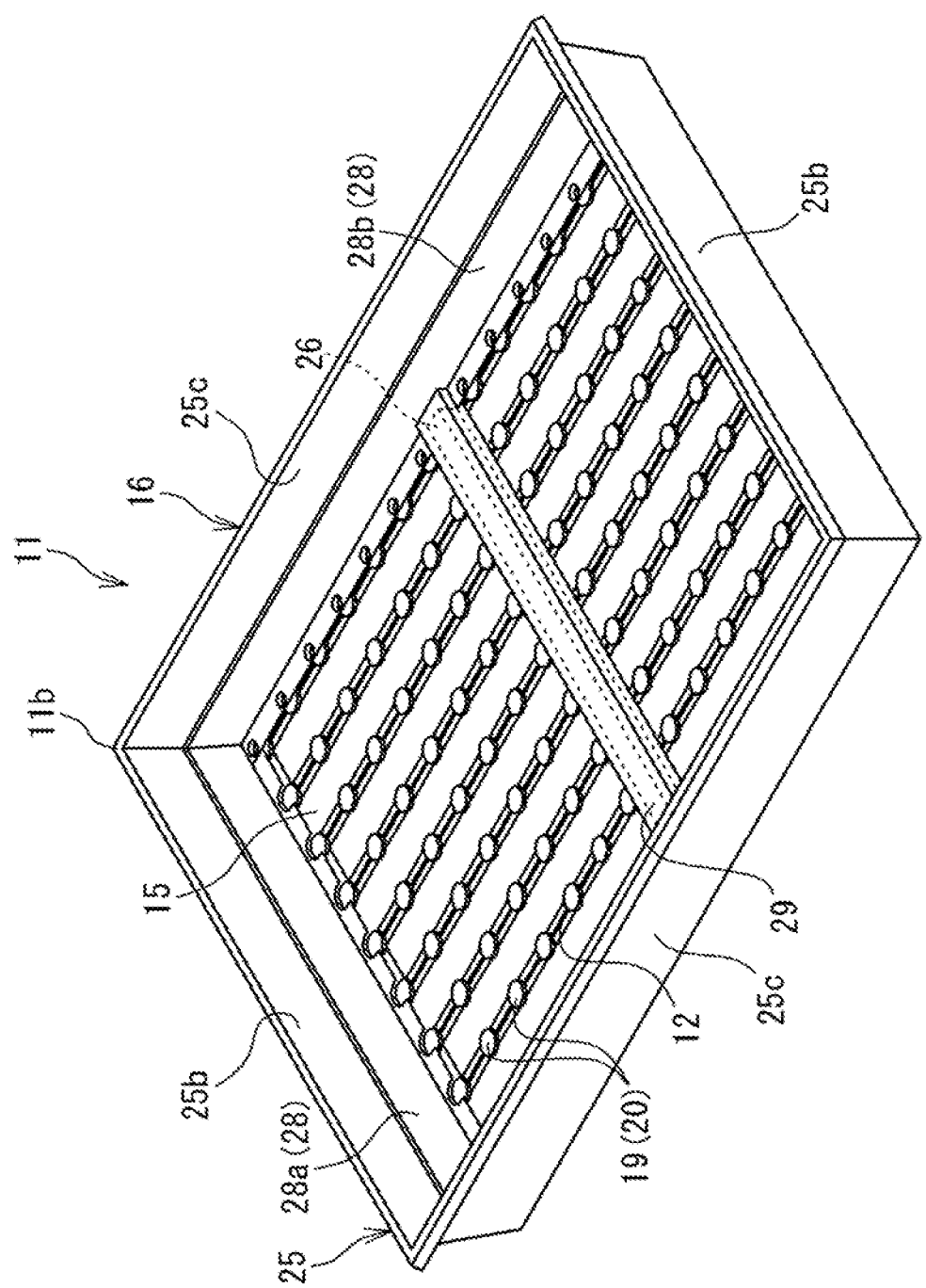
FIG. 5 is a perspective view showing a housing according to the first embodiment.
Figure 6:
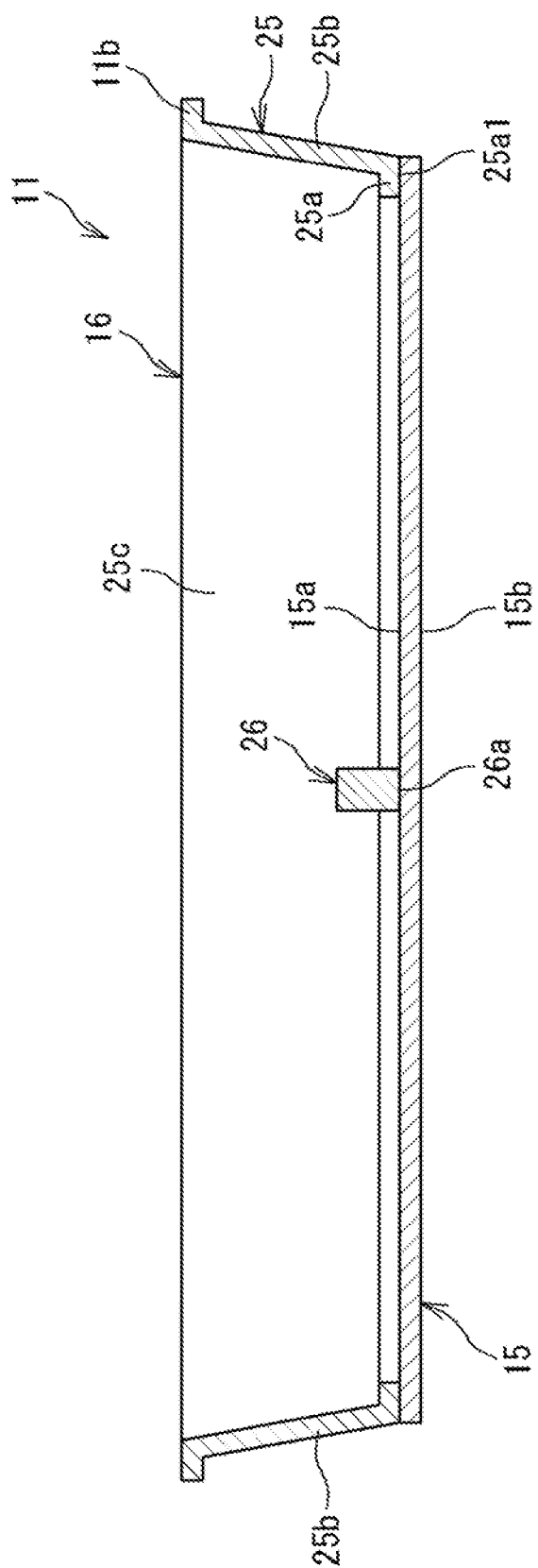
FIG. 6 is a sectional view along a longitudinal direction of a housing.

FIG. 5 is a perspective view showing the housing 11 according to the first embodiment, and FIG. 6 is a sectional view along the longitudinal direction of the housing 11. In FIGS. 5 and 6, the housing 11 is formed in a box shape (here, a rectangle (may be a square)) having a long side and a short side, and the housing 11 is configured by attaching the bottom plate 15 made of an aluminum alloy, for example, to the frame body 16 made of resin. In FIG. 6, a protective member 28 and a shielding member 29 to be described later are omitted.

The frame body 16 is formed of a resin material, such as poly butylene terephtalate (PBT) resin filled with glass fiber, and includes a frame main body portion 25 that forms an outer frame (side wall frame), and a bottom plate holding portion 26 formed integrally with the frame main body portion 25 inside the frame main body portion 25.

The frame main body portion 25 is formed by integrally forming a base portion 25a formed in a rectangular frame shape, and a pair of short-side wall portions 25b and a pair of long-side wall portions 25c protruding from the top of the base portion 25a. The outer edge of the bottom plate 15 is fixed to the bottom surface of the base portion 25a by a fastening member and an adhesive layer (not shown). Further, as described above, the flange portion 1ib to which the concentrating portion 13 (cf. FIG. 2) is attached is formed at the respective upper ends of the short-side wall portion 25b and the long-side wall portion 25c.

The bottom plate holding portion 26 is formed, for example, in a prismatic shape, and extends along the short-side direction of the housing 11 at substantially the central portion of the bottom plate 15.

Both ends in the longitudinal direction of the bottom plate holding portion 26 are connected to the inner surface of the long-side wall portion 25c. Thereby, the longitudinal central portion of the long-side wall portion 25c is prevented from being deformed so as to warp inward or outward.

Further, the bottom surface 26a of the bottom plate holding portion 26 is substantially flush with a bottom surface 25a1 of the base portion 25a and is in contact with the inner surface 15a of the bottom plate 15. Thereby, the bottom plate holding portion 26 holds the inner surface 15a of the bottom plate 15.

The bottom surface 26a of the bottom plate holding portion 26 and the inner surface 15a of the bottom plate 15 are bonded and fixed to each other by the adhesive layer made of a caulking material or the like.

As shown in FIG. 5, the housing 11 further includes the protective member 28 attached to the frame main body portion 25, and the shielding member 29 that covers the bottom plate holding portion 26. The protective member 28 is made up of a short-side protective plate 28a that covers the entire lower half of the inner surface of the short-side wall portion 25b, and a long-side protective plate 28b that covers the entire lower half of the inner surface of the long-side wall portion 25c. The protective member 28 and the shielding member 29 are made of, for example, an aluminum alloy metal plate.

The respective lower ends of the short-side protective plate 28a and the long-side protective plate 28b are bent inward and also cover the upper surface of the base portion 25a protruding inward from the short-side wall portion 25b and the long-side wall portion 25c.

When the Fresnel lens 13f (cf. FIG. 2) of the concentrating portion 13 deviates from the power generating element 20 (secondary concentrating lens 18) adjacent to the frame main body portion 25, the protective member 28 prevents the base portion 25a, the short-side wall portion 25b, and the long-side wall portion 25c of the frame main body portion 25 from being directly irradiated with the concentrated sunlight and from being damaged thermally.

Further, the shielding member 29 prevents the bottom plate holding portion 26 from being directly irradiated with the sunlight concentrated by the Fresnel lens 13f due to the sunlight shifting from the original concentrating position, and prevents the bottom plate holding portion 26 from being damaged thermally.

The bottom plate 15 is formed in a rectangular shape having a long side and a short side in accordance with the base portion 25a of the frame body 16, and bonded and fixed to the base portion 25a and the bottom plate holding portion 26 of the frame body 16 as described above. The bottom plate 15 is a plate material made of an aluminum alloy as described above, and is configured to conduct the heat of the power generating element 20 to the bottom plate 15 and prevent a rise in the temperature of the power generating element 20 during power generation.

In the following description, in FIG. 6, a direction in which the inner surface 15a of the bottom plate 15 on the inner side of the housing 11 faces (the upward direction on the paper) is referred to as a direction toward the inside of the housing, and an outer surface 15b of the bottom plate 15 on the outer side of the housing 11 faces (the downward direction on the paper) is referred to as a direction toward the outside of the housing.

Figure 7A:
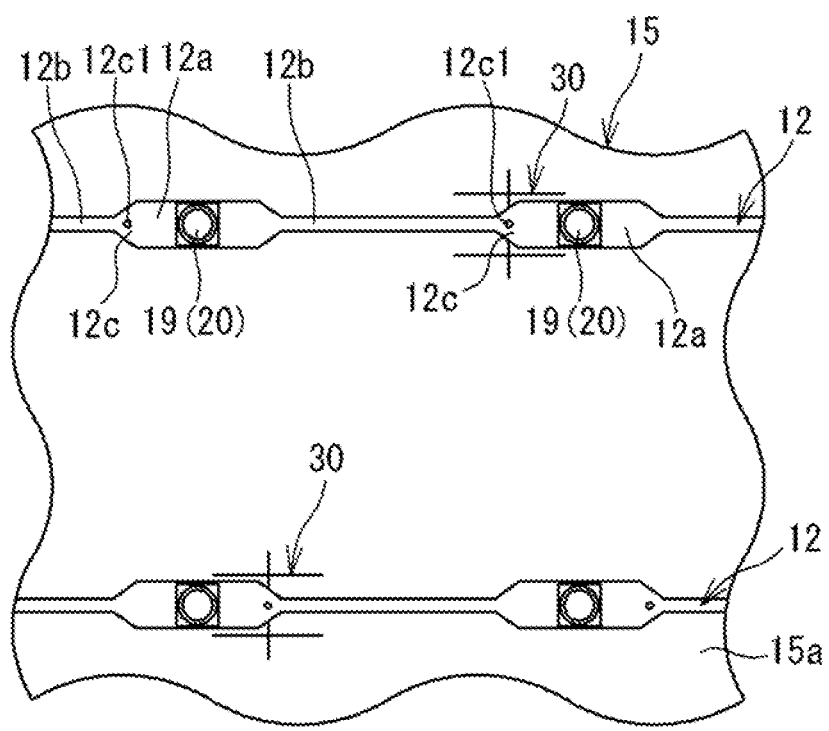
FIG. 7A is a partially enlarged view of the inner surface of a bottom plate.

FIG. 7A is a partially enlarged view of the inner surface of the bottom plate 15.

As shown in FIG. 7A, the flexible printed circuits 12, on each of which the secondary concentrating portions 19 and the power generating elements 20 are mounted, are arranged so as to form a plurality of rows on the inner surface 15a of the bottom plate 15.

The flexible printed circuit 12 is disposed such that its longitudinal direction is parallel to a long-side direction which is a direction parallel to the long side of the bottom plate 15.

On the inner surface 15a, there is a groove portion 30 formed of a minute groove recessed with respect to the inner surface 15a around a portion where the boundary portion 12c, located between a wide portion 12a and a narrow portion 12b of the flexible printed circuit 12, is disposed.

A plurality of groove portions 30 are provided to be spotted at positions where the boundary portions 12c of the flexible printed circuit 12 are disposed in the attachment position of the flexible printed circuit 12 on the inner surface 15a of the bottom plate 15.

Accordingly, the plurality of groove portions 30 function as markers for positioning the flexible printed circuit 12 at the time of attaching the flexible printed circuit 12.

Figure 7B:
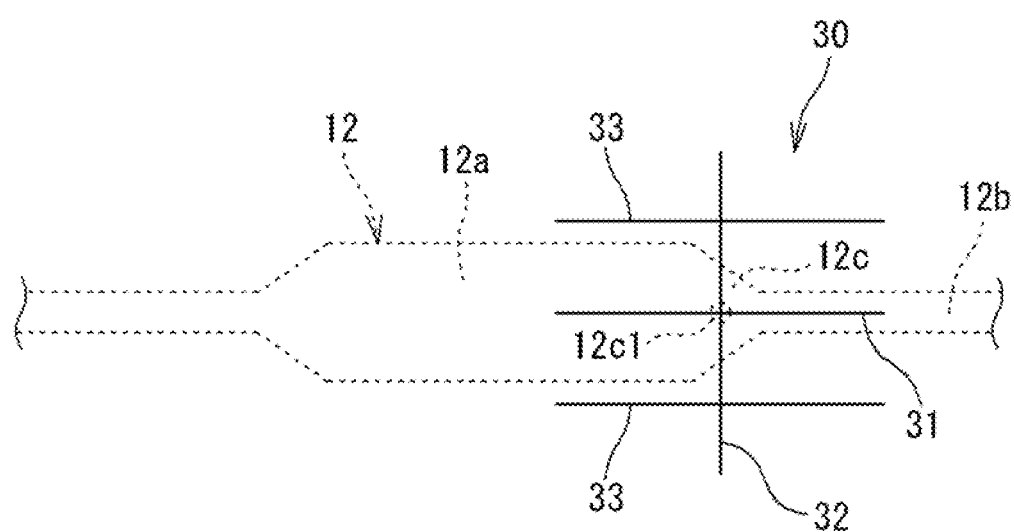
FIG. 7B is an enlarged view of a groove portion.

FIG. 7B is an enlarged view of the groove portion 30. In FIG. 7B, the flexible printed circuit 12 is indicated by a broken line.

As shown in FIG. 7B, the groove portion 30 is configured including: a first groove 31 formed linearly along the longitudinal direction of the flexible printed circuit 12 (the long-side direction of the bottom plate 15) at substantially the center in the width direction of the flexible printed circuit 12; a linear second groove 32 that intersects with the first groove 31; and a pair of third grooves 33 that are parallel to the first groove 31 and formed linearly on both sides of the first groove 31.

The first groove 31, the second groove 32, and the third groove 33 constituting the groove portion 30 are minute grooves that are recessed with respect to the inner surface 15a and are formed by pressing, a marking needle, or the like. For example, the groove width and groove depth of each of the first groove 31, the second groove 32, and the third groove 33 are about several hundredths of a millimeter. The plate thickness of the bottom plate 15 is about 1 mm.

Further, in the present embodiment, the length of each of the first groove 31, the second groove 32, and the third groove 33 constituting the groove portion 30 has been set to about 20 mm, and the interval between the first groove 31 and the third groove 33 has been set to 5 mm.

The first groove 31 and the pair of third grooves 33 indicate an approximate position of the boundary portion 12c of the flexible printed circuit 12.

Further, as shown in FIGS. 7A and 7B, a hole 12c1 is formed in the boundary portion 12c of the flexible printed circuit 12. The flexible printed circuit 12 is attached such that the intersection of the first groove 31 and the second groove 32 is exposed from the hole 12c1. As a result, the flexible printed circuit 12 can be positioned and attached to the groove portion 30 with high precision in the hole 12c1.

Figure 8:
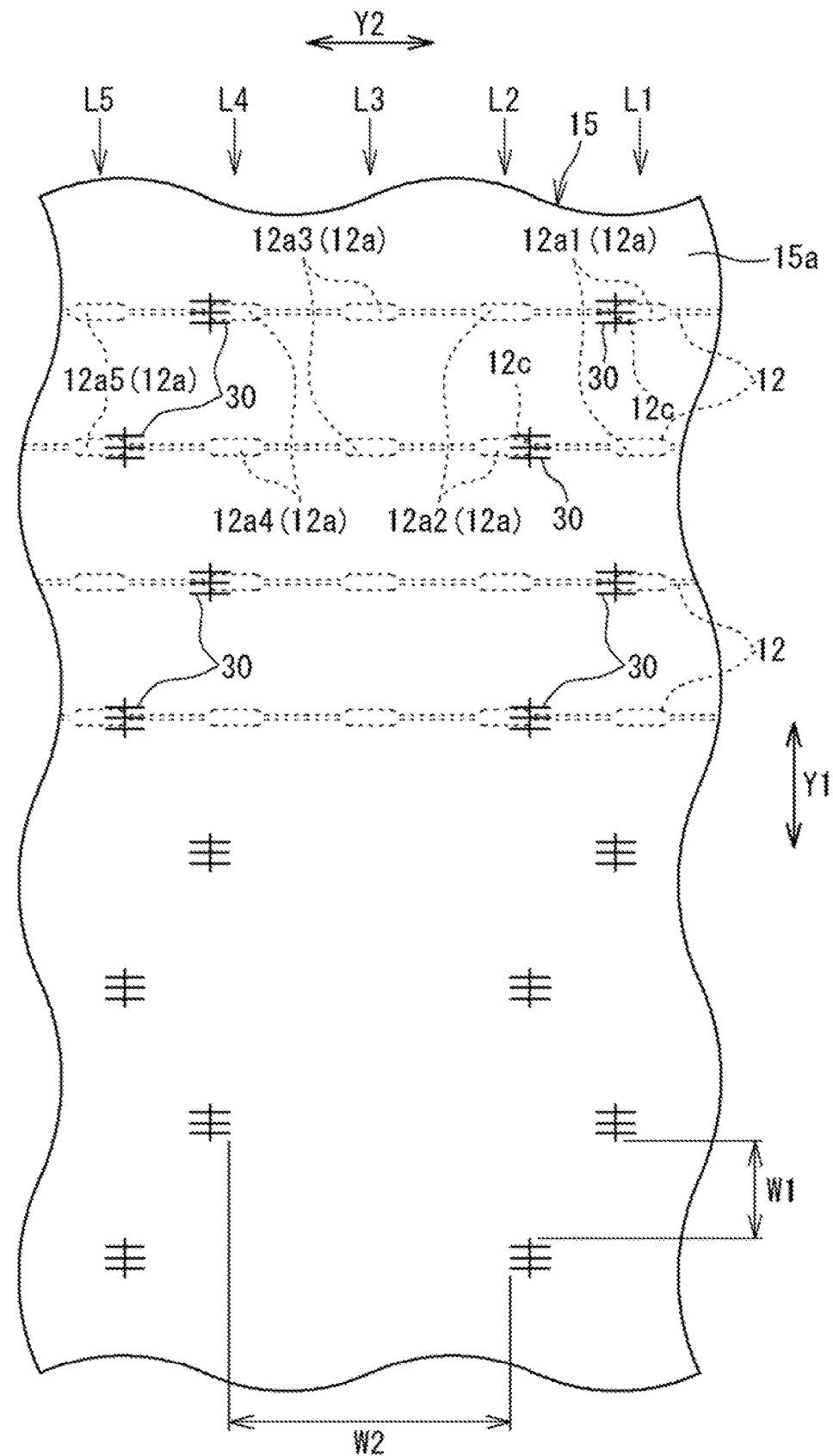
FIG. 8 is a view showing a part of arrangement of the groove portions on the inner surface of the bottom plate.

FIG. 8 is a view showing a part of the arrangement of the groove portions 30 on the inner surface 15a of the bottom plate 15. In FIG. 8, an arrow Y1 indicates a short-side direction parallel to the short side of the bottom plate 15. An arrow Y2 indicates the long-side direction of the bottom plate 15. In FIG. 8, the flexible printed circuit 12 is indicated by a broken line, and some of the plurality of rows of the flexible printed circuits 12 are omitted.

As shown in FIG. 8, the flexible printed circuits 12 are arranged in a plurality of rows at equal intervals with a predetermined pitch.

Further, the wide portions 12a of the flexible printed circuits 12 are disposed along the short-side direction.

Therefore, the wide portions 12a of the flexible printed circuits 12 are arranged at equal intervals along the long-side direction and at equal intervals along the short-side direction.

The plurality of groove portions 30 are arranged along the long-side direction and the short-side direction.

In the short-side direction, the groove portions 30 are arranged at the same distance as the pitch between two adjacent rows of the plurality of rows of flexible printed circuits 12.

The arrangement in the short-side direction of the groove portions 30 is made with reference to a pair of rows in the short-side direction made up of a pair of adjacent wide portions 12a.

In FIG. 8, a row L1 formed of a plurality of wide portions 12a1 arranged in the short-side direction and a row L2 formed of a plurality of wide portions 12a2 arranged in the short-side direction constitute a pair of rows in the short-side direction made up of a pair of adjacent wide portions 12a.

The groove portions 30 are arranged along the short-side direction by being alternately formed at the position of the boundary portion 12c located inside between the row L1 formed of the wide portions 12a1 and the row L2 formed of the wide portions 12a2.

For example, in FIG. 8, the groove portion 30 disposed on the rightmost side of the uppermost stage is formed at the position of the boundary portion 12c on the wide portion 12a2 side in the wide portion 12a1 belonging to the row L1.

The groove portion 30 adjacent in the short-side direction to the groove portion 30 disposed on the rightmost side of the uppermost stage is formed at the position of the boundary portion 12c on the wide portion 12a1 side in the wide portion 12a2 belonging to the row L2.

As thus described, the groove portions 30 are arranged at equal intervals along the short-side direction with reference to a pair of rows in the short-side direction made up of a pair of adjacent wide portions 12a.

Further, in FIG. 8, a row L4 formed of a plurality of wide portions 12a4 arranged in the short-side direction and a row L5 formed of a plurality of wide portions 12a5 arranged in the short-side direction also constitute a pair of rows in the short-side direction made up of a pair of wide portions 12a adjacent to each other.

Therefore, the groove portions 30 are arranged along the short-side direction with reference to the row L4 formed of the plurality of wide portions 12a4 and the row L5 formed of the plurality of wide portions 12a5.

A row L3 in the short-side direction formed of a plurality of wide portions 12a3 arranged in the short-side direction is interposed between the pair of rows L1, L2 in the short-side direction made up of the wide portions 12a1, 12a2 and the pair of rows L4, L5 in the short-side direction made up of the wide portions 12a4, 12a5.

For this reason, the groove portions 30 are arranged along the long-side direction at a certain distance by sandwiching two wide portions 12a adjacent to each other among the wide portions 12a arranged in the long-side direction.

Here, in FIG. 8, an interval W1 between the pair of groove portions 30 adjacent to each other in the short-side direction is narrower than an interval W2 between the pair of groove portions 30 adjacent to each other in the long-side direction.

Here, the interval W2 indicates the minimum interval between columns made up of the plurality of groove portions 30 arranged along the short-side direction.

For example, when the long side of the bottom plate 15 is 800 mm and the short side is 600 mm, the interval W1 is set to 50 mm and the interval W2 is set to 130 mm. In this case, there are four rows in which the groove portions 30 are arranged along the short-side direction, and ten rows in which the groove portions 30 are arranged along the long-side direction.

As thus described, a plurality of groove portions 30 are provided to be spotted at positions corresponding to the attachment position of the flexible printed circuit 12 on the inner surface 15a of the bottom plate 15, whereby the groove portion 30 functions as a positioning marker for the flexible printed circuit 12 at the time of attachment of the flexible printed circuit 12 to the inner surface 15a.

Further, the plurality of groove portions 30 have a function of reducing thermal expansion on the inner surface 15a side of the bottom plate 15.

In the groove portion 30 that is a minute groove, when the bottom plate 15 thermally expands, the groove width of each of the grooves 31, 32, 33 constituting the groove portion 30 is narrowed. The amount of expansion in the surface direction of the bottom plate 15 is reduced by the amount by which the groove width of each of the grooves 31, 32, 33 is narrowed.

Thus, on the inner surface 15a that is the surface provided with the groove portion 30, when the bottom plate 15 thermally expands, the width of each of the grooves 31, 32, 33 constituting the groove portion 30 is narrowed, and the amount of expansion in the surface direction on the inner surface 15a side is reduced.

On the other hand, the groove portion 30 is not formed on the outer surface 15b (FIG. 6) that is the surface of the bottom plate 15 opposite to the inner surface 15a. Therefore, the amount of expansion on the outer surface 15b of the bottom plate 15 is relatively large, with no groove portion 30 being formed thereon.

That is, the groove portion 30 reduces the thermal expansion on the inner surface 15a side of the bottom plate 15, thereby being able to make the amount of expansion on the inner surface 15a side relatively smaller than the amount of expansion on the outer surface 15b side.

According to the concentrator photovoltaic module having the above configuration, since the groove portion 30 for reducing the thermal expansion on the inner surface 15a side of the bottom plate 15 is provided on the inner surface 15a of the bottom plate 15, when the bottom plate 15 thermally expands, the amount of expansion due to the thermal expansion on the inner surface 15a side can be made relatively smaller than the amount of expansion on the outer surface 15b side.

For this reason, when the bottom plate 15 is thermally expanded, the bottom plate 15 can be bent so as to protrude in the direction toward the outside of the housing, and as a result, the bottom plate 15 can be prevented from bending in the direction toward the inside of the housing due to the thermal expansion.

Further, since each groove portion 30 includes the first groove 31 formed linearly along the long-side direction of the bottom plate 15 and the linear second groove 32 intersecting with the first groove 31, the direction in which the thermal expansion is reduced by the groove portion 30 can be made multidirectional within the inner surface 15a, and the position on the bottom plate 15 can be clearly displayed by the groove portion 30.

Moreover, in the present embodiment, the interval W1 between the pair of groove portions 30 adjacent to each other in the short-side direction is narrower than the interval W2 between the pair of groove portions 30 adjacent to each other in the long-side direction. Thereby, more groove portions 30 are arranged along the short-side direction, and hence the groove portions 30 can be arranged so as to divide the bottom plate 15 in the long-side direction. As a result, it is possible to facilitate the bending in the direction toward the outside of the housing in the long-side direction in which the bottom plate is likely to bend as compared to the short-side direction, and it is possible to facilitate the bottom plate 15 to bend so as to protrude in the direction toward the outside of the housing when the bottom plate expands thermally.

In addition, in the present embodiment, the frame body 16 constituting the housing 11 includes the frame main body portion 25 that forms the outer frame, and the bottom plate holding portion 26 extending along the inner surface 15a of the bottom plate 15 and formed integrally with the frame main body portion 25 inside the frame main body portion 25, so that the bottom plate holding portion 26 can prevent the bottom plate 15 from bending in the direction toward the inside of the housing due to thermal expansion.

In addition, since the plurality of groove portions 30 of the present embodiment function as markers for positioning the flexible printed circuit 12, it is not necessary to separately provide a marker for positioning the flexible printed circuit 12, and man-hours and cost can be reduced.

Second Embodiment

Figure 9:
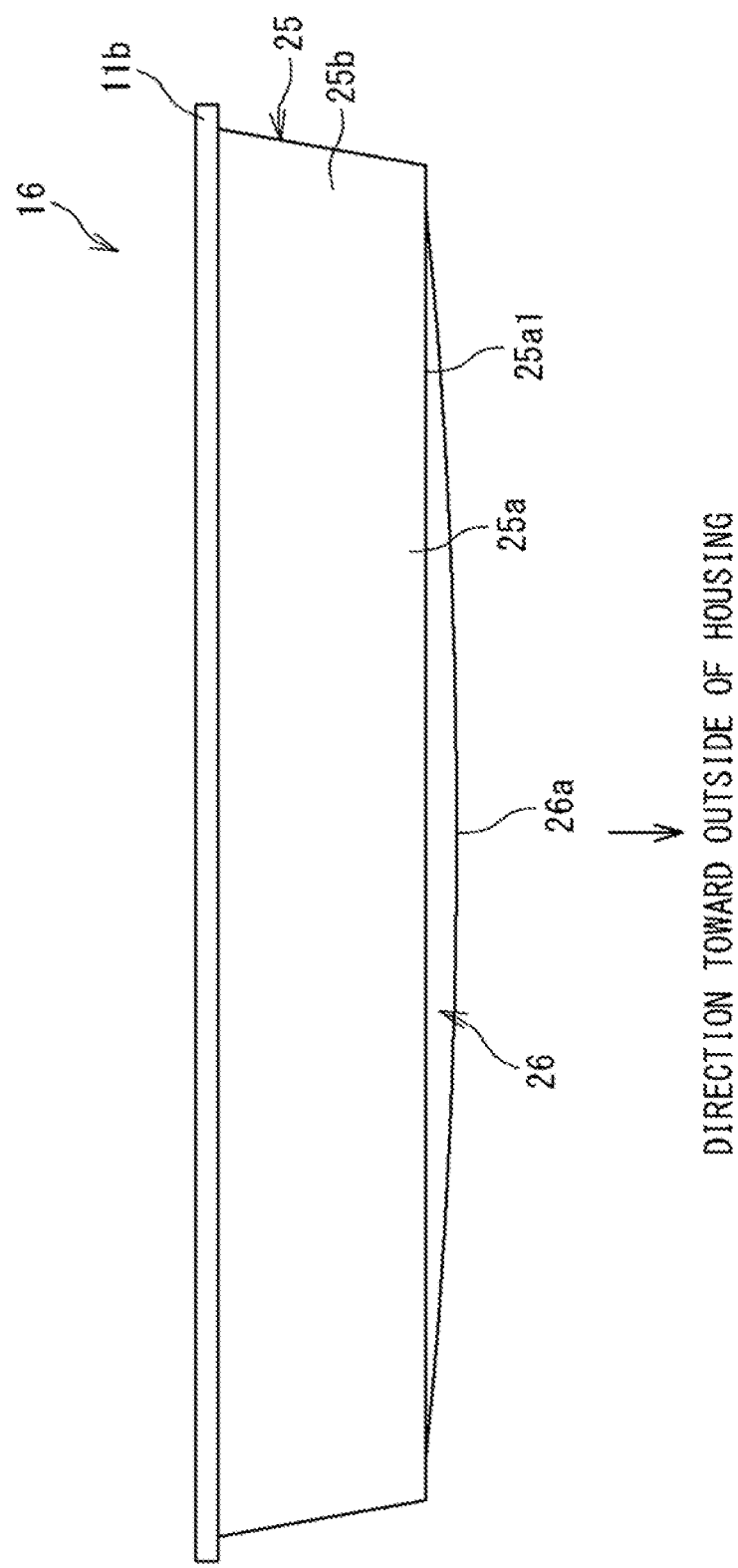
FIG. 9 is a side view of a frame body constituting a housing according to a second embodiment.

FIG. 9 is a side view of the frame body 16 constituting the housing 11 according to the second embodiment.

The frame body 16 of the present embodiment is different from the first embodiment in that the bottom surface 26a of the bottom plate holding portion 26 is formed in a convex shape so as to protrude in the direction toward the outside of the housing. The other points are the same as in the first embodiment.

As shown in FIG. 9, the bottom surface 26a of the bottom plate holding portion 26, which is a contact surface in contact with the inner surface 15a of the bottom plate 15, is formed in the convex shape so as to protrude in the direction toward the outside of the housing from the bottom surface 25a1 of the base portion 25a In FIG. 9, the amount of protrusion of the bottom plate holding portion 26 is exaggerated for easy understanding.

Since the bottom surface 26a of the bottom plate holding portion 26 is formed in the convex form so as to protrude in the direction toward the outside of the housing, the bottom plate 15 having the outer edge attached to the frame body 16 by the fastening member and the adhesive layer is pressed by the bottom plate holding portion 26 so as to protrude in the direction toward the outside of the housing.

In the present embodiment, since the bottom plate 15 can be bent in advance in the direction toward the outside of the housing by the bottom plate holding portion 26, it is possible to more effectively prevent the bottom plate 15 from bending in the direction toward the inside of the housing due to thermal expansion.

Verification Test

Next, a verification test performed using the module 10 according to the above embodiment will be described.

As an example product 1, the concentrator photovoltaic module described in the first embodiment was used. As an example product 2, a module was used which was different from the module of the first embodiment in that the bottom plate holding portion 26 is not provided. Further, as a comparative example product, a module was used which was different from the module of the first embodiment in that the bottom plate holding portion 26 or the plurality of groove portions 30 on the inner surface 15a of the bottom plate 15 were not provided. The example products 1, 2 and the comparative example product were caused to generate power under the same conditions, and the amount of bending of the bottom plate 15 and the output at that time were compared. Note that the amount of bending was obtained with reference to a plane determined by the bottom surface of the base portion of the frame body, and the amount of bending in a location where the bending was the largest among the entire bottom plate was employed.

As the test conditions, the example product and the comparative example product were caused to generate power for a certain period of time at an outside air temperature of 50 degrees. At this time, the temperature of the bottom plate was 90 degrees, and the temperature of the concentrating portion (concentrating lens) was 70 degrees.

As a result of the test, in both the example products 1, 2, the amount of bending of the bottom plate was 2 mm, and the bottom plate bent in the direction toward the outside of the housing. On the other hand, in the comparative example product, the amount of bending of the bottom plate was 5 mm, and the bottom plate bent in the direction toward the inside of the housing.

Further, the output of the comparative example product appeared 10% lower than the output of each of the example products 1, 2.

It is clear from the above results that, according to the module of the present embodiment, it is possible to prevent the bending of the bottom plate in the direction toward the inside of the housing due to thermal expansion, and it is possible to prevent a decrease in power generation efficiency.

Others

The embodiments disclosed herein should be considered as illustrative and non-restrictive in every respect.

The arrangement and shape of the groove portion 30 shown in the above embodiments are examples and can be changed as appropriate.

In each of the above embodiments, the case has been illustrated where the groove portion 30 is provided only on the inner surface 15a of the bottom plate 15 and the groove portion 30 is not provided on the outer surface 15b of the bottom plate 15. However, the groove portion 30 formed on the inner surface 15a only needs to make the amount of expansion on the inner surface 15a side relatively smaller than the amount of expansion on the outer surface 15b side by reducing the thermal expansion on the inner surface 15a side of the bottom plate 15.

Thus, for example, when a groove portion similar to the groove portion 30 is formed on the outer surface 15b of the bottom plate 15, it is only necessary that by adjusting the arrangement, density, shape, and the like of the groove portion 30 on the inner surface 15a, the groove portion 30 is provided such that the amount of expansion on the inner surface 15a side is relatively smaller than the amount of expansion on the outer surface 15b side. It is thereby possible to prevent the bottom plate 15 from bending in the direction toward the inside of the housing due to thermal expansion.

Figure 10A:
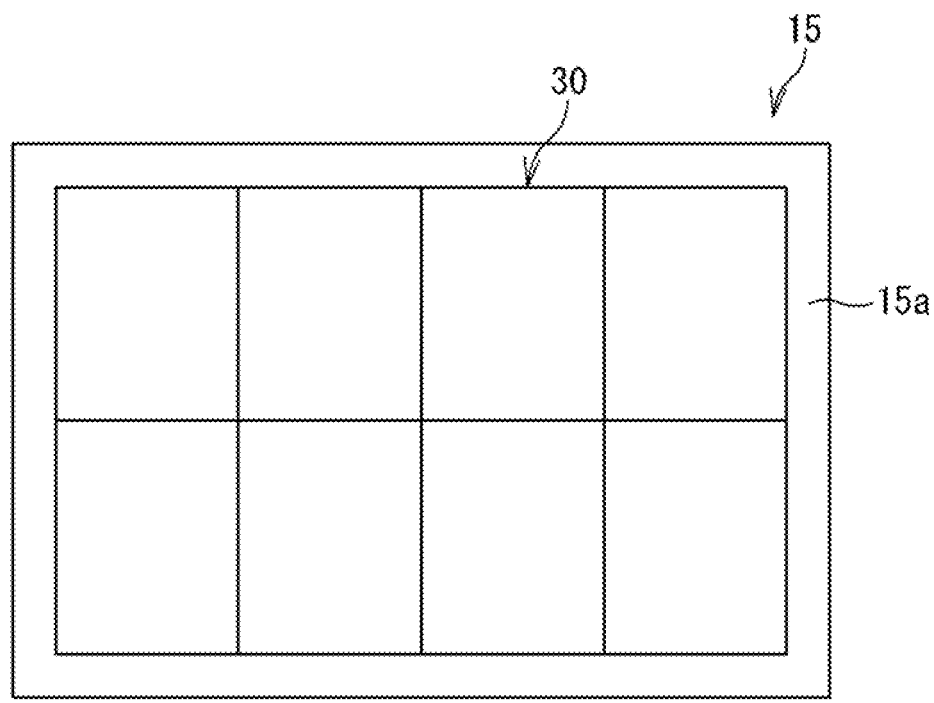
FIG. 10A is a view showing a modification of the groove portion on the inner surface of the bottom plate.
Figure 10B:
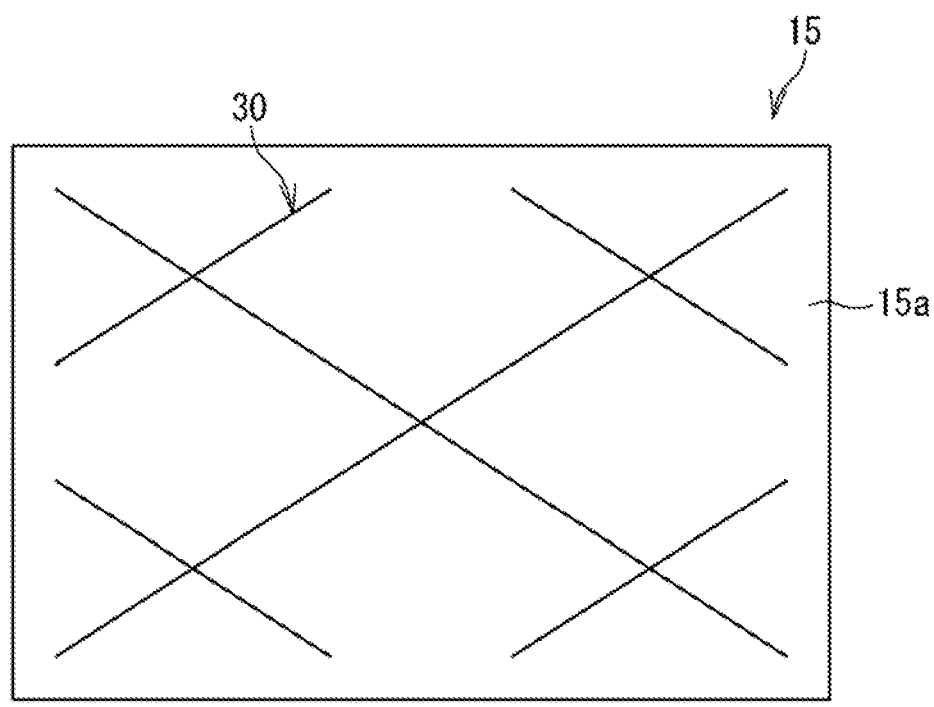
FIG. 10B is a view showing another modification of the groove portion on the inner surface of the bottom plate.

Further, in each of the above embodiments, the case has been illustrated where the groove portion 30 is made up of the first groove 31, the second groove 32, and the third groove 33. However, it is only necessary that the thermal expansion on the inner surface 15a side of the bottom plate 15 is reduced, and the amount of expansion due to thermal expansion on the inner surface 15a side is made relatively smaller than the amount of expansion on the outer surface 15b side when the bottom plate 15 expands thermally. Therefore, for example, if the function as the marker for the flexible printed circuit 12 is not considered, there may be formed a groove portion 30 configured by combining a plurality of grooves parallel to the long-side direction and a plurality of grooves parallel to the short-side direction on almost the entire inner surface 15a of the bottom plate 15 as shown in FIG. 10A. Also, there may be formed a groove portion 30 configured by combining a plurality of oblique grooves extending in an oblique direction intersecting with the long side and the short side on almost the entire inner surface 15a of the bottom plate 15 as shown in FIG. 10B. Further, there may be formed a groove portion 30 configured by combining grooves parallel to the long-side direction, grooves parallel to the short-side direction, and oblique grooves in a freely selectable manner.

The scope of the present invention is illustrated not by the meaning described above but by the scope of the claims, and is intended to include the meanings equivalent to the scope of the claims and all modifications within the scope.

REFERENCE SIGNS LIST

1: CONCENTRATOR PHOTOVOLTAIC PANEL
2: PEDESTAL
3: BASE
4: SUPPORT PORTION
5: DRIVE DEVICE
6: SHAFT
7: BEAM
8: ATTACHMENT RAIL
10: CONCENTRATOR PHOTOVOLTAIC MODULE
11: HOUSING
11b: FLANGE PORTION
12: FLEXIBLE PRINTED CIRCUIT
12a, 12a1, 12a2, 12a3, 12a4, 12a5: WIDE PORTION
12b: NARROW PORTION
12c: BOUNDARY PORTION
12c1: HOLE
12f: FLEXIBLE SUBSTRATE
13: CONCENTRATING PORTION
13f: FRESNEL LENS
15: BOTTOM PLATE
15a: INNER SURFACE
15b: OUTER SURFACE
16: FRAME BODY
17: PACKAGE
18: BALL LENS
19: SECONDARY CONCENTRATING PORTION
20: POWER GENERATING ELEMENT
21: SEALING PORTION
25: FRAME MAIN BODY PORTION
25a: BASE PORTION
25a1: BOTTOM SURFACE
25b: SHORT-SIDE WALL PORTION
25c: LONG-SIDE WALL PORTION
26: BOTTOM PLATE HOLDING PORTION
26a: BOTTOM SURFACE
28: PROTECTIVE MEMBER

28a: SHORT-SIDE PROTECTIVE PLATE
28b: LONG-SIDE PROTECTIVE PLATE
29: SHIELDING MEMBER
30: GROOVE PORTION
31: FIRST GROOVE
32: SECOND GROOVE
33: THIRD GROOVE
100: CONCENTRATOR PHOTOVOLTAIC APPARATUS

The invention claimed is:

1. A concentrator photovoltaic module comprising:
a concentrating portion configured by arranging a plurality of concentrating lenses that concentrate sunlight;
a plurality of power generating elements arranged at positions corresponding respectively to the plurality of concentrating lenses;
a plurality of secondary concentrating lenses that are provided corresponding respectively to the plurality of power generating elements and guide the sunlight concentrated by the plurality of concentrating lenses to the plurality of power generating elements;
a housing that contains the plurality of secondary concentrating lenses and the plurality of power generating elements, wherein
the housing includes:
a resin frame body; and
a metal bottom plate that is fixed to the frame body, and on an inner surface of which the plurality of secondary concentrating lenses and the plurality of power generating elements are arranged, and
a plurality of spaced apart groove portions for reducing thermal expansion of an inner surface side of the bottom plate is provided on the inner surface of the bottom plate; and
a wiring board attached to the inner surface of the bottom plate and provided with the plurality of power generating elements, wherein
a plurality of holes is provided in the wiring board, the plurality of holes penetrating in a direction crossing the inner surface,
each of the plurality of groove portions includes a linear first groove and a linear second groove intersecting with the first groove, and
an intersection of the first groove and the second groove is exposed from one of the plurality of holes.

2. The concentrator photovoltaic module according to claim 1, wherein
the bottom plate is in a rectangular shape having long sides and short sides,
the plurality of groove portions are arranged along a long-side direction and a short-side direction, and
an interval between a pair of the groove portions adjacent to each other in the short-side direction is narrower than an interval between a pair of the groove portions adjacent to each other in the long-side direction.

3. The concentrator photovoltaic module according to claim 1, wherein
the frame body includes
a frame main body portion that configures an outer frame, and
a bottom plate holding portion that extends along the inner surface of the bottom plate inside the frame main body portion and is integral with the frame main body portion at both ends.

4. The concentrator photovoltaic module according to claim 3, wherein a contact surface being in contact with the inner surface of the bottom plate in the bottom plate holding portion has a convex shape so as to protrude in a direction toward an outside of the housing.

5. A concentrator photovoltaic panel comprising a plurality of the concentrator photovoltaic modules according to claim 1 that are arranged.

6. A concentrator photovoltaic apparatus comprising:
the concentrator photovoltaic panel according to claim 5; and
a drive device that drives the concentrator photovoltaic panel to face the sun and follow movement of the sun.

* * * * *